(12) United States Patent
Norman

(10) Patent No.: US 7,818,523 B2
(45) Date of Patent: Oct. 19, 2010

(54) SECURING DATA IN MEMORY DEVICE

(75) Inventor: Robert Norman, Pendleton, OR (US)

(73) Assignee: Unity Semiconductor Corporation

( * ) Notice: Subject to any disclaimer, the term of this patent is extended or adjusted under 35 U.S.C. 154(b) by 457 days.

(21) Appl. No.: 12/008,345

(22) Filed: Jan. 10, 2008

(65) Prior Publication Data

US 2009/0182965 A1    Jul. 16, 2009

(51) Int. Cl.
  *G06F 13/00*  (2006.01)
(52) U.S. Cl. .............................. 711/163; 711/E12.093; 713/190; 365/129
(58) Field of Classification Search ................ 711/163, 711/E12.093; 713/190; 365/129
  See application file for complete search history.

(56) References Cited

U.S. PATENT DOCUMENTS

| 5,825,878 | A * | 10/1998 | Takahashi et al. ........... 713/190 |
| 7,327,600 | B2 | 2/2008 | Norman |
| 2008/0005459 | A1 | 1/2008 | Norman |
| 2008/0084727 | A1 | 4/2008 | Norman |

OTHER PUBLICATIONS

U.S. Appl. No. 12/004,740, filed Dec. 23, 2007, Robert Norman.
U.S. Appl. No. 12/004,768, filed Dec. 22, 2007, Robert Norman.
U.S. Appl. No. 11/975,275, filed Oct. 17, 2007, Robert Norman.
U.S. Appl. No. 11/893,647, filed Aug. 16, 2007, Robert Norman.
U.S. Appl. No. 11/843,644, filed Aug. 16, 2007, Robert Norman.
U.S. Appl. No. 12/004,192, filed Dec. 20, 2007, Robert Norman.
U.S. Appl. No. 12/004,292, filed Dec. 19, 2007, Robert Norman.
U.S. Appl. No. 12/005,685, filed Dec. 28, 2007, Robert Norman.
U.S. Appl. No. 12/004,734, filed Dec. 24, 2007, Robert Norman.
U.S. Appl. No. 12/006,006, filed Dec. 29, 2007, Robert Norman.
U.S. Appl. No. 12/008,077, filed Jan. 7, 2008, Robert Norman.
U.S. Appl. No. 12/006,970, filed Jan. 8, 2008, Robert Norman.
U.S. Appl. No. 12/008,212, filed Jan. 9, 2008, Robert Norman.
U.S. Appl. No. 12/006,187, filed Dec. 31, 2007, Robert Norman.

* cited by examiner

*Primary Examiner*—Yong Choe

(57) ABSTRACT

The various embodiments of the invention relate generally to semiconductors and memory technology. More specifically, the various embodiment and examples of the invention relate to memory devices, systems, and methods that protect data stored in one or more memory devices from unauthorized access. The memory device may include third dimension memory that is positioned on top of a logic layer that includes active circuitry in communication with the third dimension memory. The third dimension memory may include multiple layers of memory that are vertically stacked upon each other. Each layer of memory may include a plurality of two-terminal memory elements and the two-terminal memory elements can be arranged in a two-terminal cross-point array configuration. At least a portion of one or more of the multiple layers of memory may include an obfuscation layer configured to conceal data stored in one or more of the multiple layers of memory.

15 Claims, 6 Drawing Sheets

SECURING DATA IN MEMORY DEVICE

CROSS-REFERENCE TO RELATED APPLICATIONS

This application incorporates by reference for all purposes U.S. patent application Ser. No. 11/095,026, now U.S. Published Application No. 2006/10171200, filed Mar. 30, 2005 and entitled "Memory Using Mixed Valence Conductive Oxides."

FIELD OF THE INVENTION

The various embodiments and examples of the invention relate generally to semiconductors and memory technology. More specifically, the various embodiments of the invention relate to memory devices, systems, and methods that protect data from unauthorized access.

BACKGROUND

Nonvolatile memory devices generally do not provide data protection. Some devices provide limited device-level data protection, such as a write-protect switch that prevents modification of the write-protected data. However, the write-protect switch can easily be switched off. Users of existing nonvolatile memory devices typically rely on software protections, such as encrypting a file and/or protecting it with a password before storing it on a memory device. However, software-enabled protections generally require the users to take measures to protect each file. Moreover, not all software applications include the capability to encrypt a file or add password protection to that file. Even if a file is encrypted and/or password protected, a determined user (e.g., a hacker) having access to the file may be able to decrypt the file and/or crack the password protection.

Existing nonvolatile memory devices inherently do not provide hardware protection against a user that is determined to access the contents stored in the devices. These memory devices generally store data in one or more memory chips that are bonded onto a circuit board. The memory chips are typically accessible, and, thus, can be physically removed from the circuit board. As such, a determined user can readily remove the memory chips and probe the pins (or terminals) by applying appropriate control signals to read data stored therein. Furthermore, the housing that encapsulates the chips (e.g., such as a semiconductor package) can be removed to expose the semiconductor die and its integrated circuits. In some cases, the determined user can directly probe the exposed die to read the contents of the memory cells.

There are continuing efforts to improve data protection and data security in memory devices.

BRIEF DESCRIPTION OF THE DRAWINGS

Various examples are disclosed in the following detailed description and the accompanying drawings.

Like reference numerals refer to corresponding parts throughout the several views of the drawings.

DETAILED DESCRIPTION

Figure 1A:
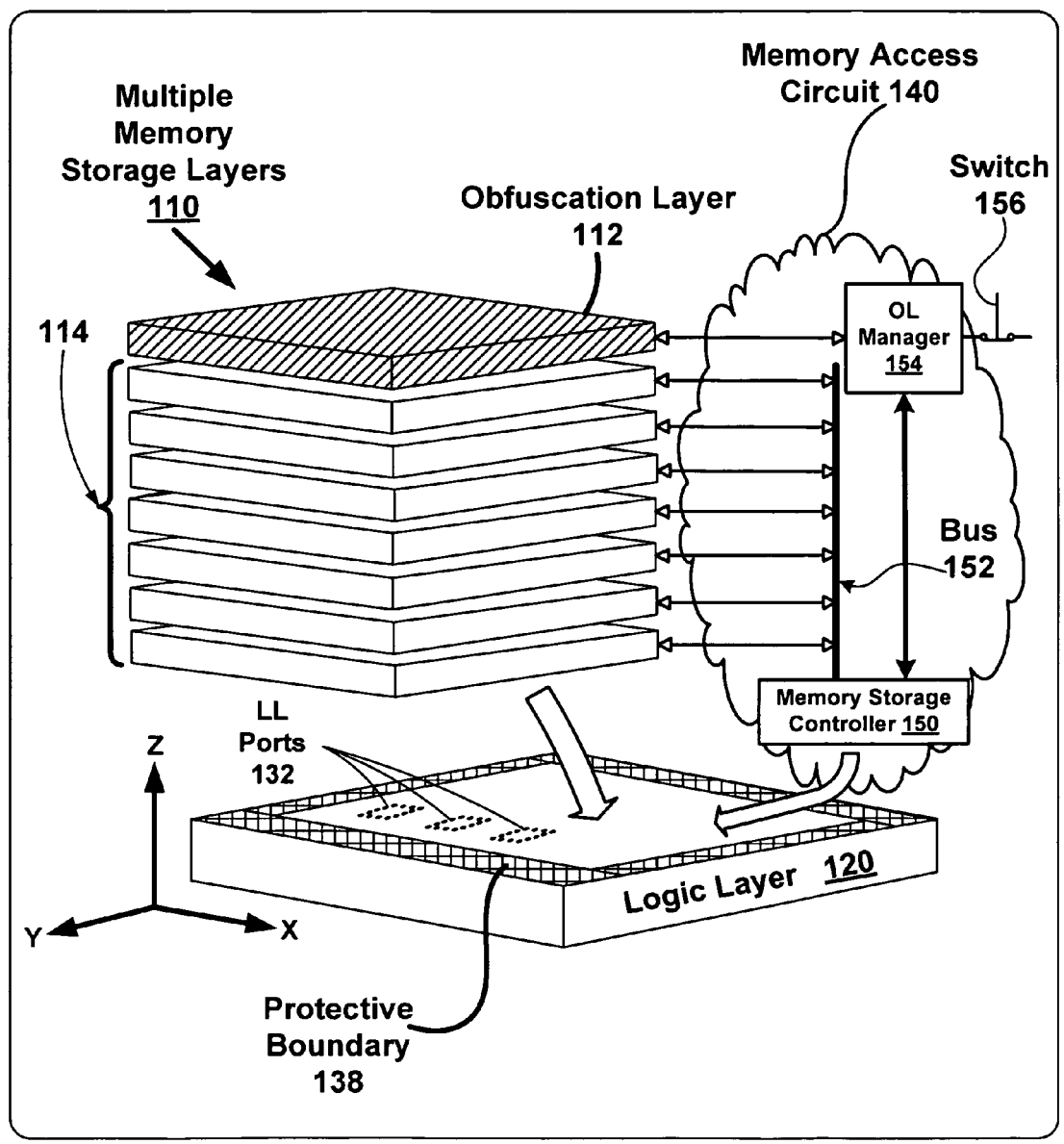
FIG. 1A illustrates an exemplary memory device.

Various embodiments or examples may be implemented in numerous ways, including as a system, a process, an apparatus, or a series of program instructions on a computer readable medium such as a computer readable storage medium or a computer network where the program instructions are sent over optical, electronic, or wireless communication links. In general, operations of disclosed processes may be performed in an arbitrary order, unless otherwise provided in the claims.

A detailed description of one or more examples is provided below along with accompanying figures. The detailed description is provided in connection with such examples, but is not limited to any particular example. The scope is limited only by the claims, and numerous alternatives, modifications, and equivalents are encompassed. Numerous specific details are set forth in the following description in order to provide a thorough understanding. These details are provided as examples and the described techniques may be practiced according to the claims without some or all of the accompanying details. For clarity, technical material that is known in the technical fields related to the examples has not been described in detail to avoid unnecessarily obscuring the description.

In some examples, techniques such as those described herein enable emulation of multiple memory types for implementation on a single component such as a wafer, substrate, or die. U.S. patent application Ser. No. 11/095,026, now U.S. Published Application No. 2006/0171200, filed Mar. 30, 2005, and titled "Memory Using Mixed Valence Conductive Oxides," hereby incorporated by reference in its entirety and for all purposes, describes two-terminal memory cells that can be arranged in a cross-point array. The application describes a two-terminal memory element that changes conductivity when exposed to an appropriate voltage drop across the two terminals. The memory element includes an electrolytic tunnel barrier and a mixed valence conductive oxide. The voltage drop across the electrolytic tunnel barrier causes an electrical field within the mixed valence conductive oxide that is strong enough to move oxygen ions out of the mixed valence conductive oxides and into the electrolytic tunnel barrier. Oxygen depletion causes the mixed valence conductive oxide to change its valence, which causes a change in conductivity. Both the electrolytic tunnel barrier and the mixed valence conductive oxide do not need to operate in a silicon substrate, and, therefore, can be fabricated above circuitry being used for other purposes (such as selection circuitry). The two-terminal memory elements can be arranged in a cross-point array such that one terminal is electrically coupled with an x-direction line and the other terminal is electrically coupled with a y-direction line. A stacked cross-point array consists of multiple cross-point arrays vertically stacked upon one another, sometimes sharing x-direction and y-direction lines between layers, and sometimes having isolated lines. When a first write voltage $V_{w1}$ is applied across the memory element, (typically by applying $½ V_{w1}$ to the x-direction line and $½ -V_{w1}$ to the y-direction line) it switches to a low resistive state. When a second write voltage $V_{w2}$ is applied across the memory element, (typically by applying $½ V_{w2}$ to the x-direction line and $½ -V_{w2}$ to the y-direction line) it switches to a high resistive state. Typically, memory elements using electrolytic tunnel barriers and mixed valence conductive oxides require $V_{w1}$ to be opposite in polarity from $V_{w2}$.

Figure 1B:
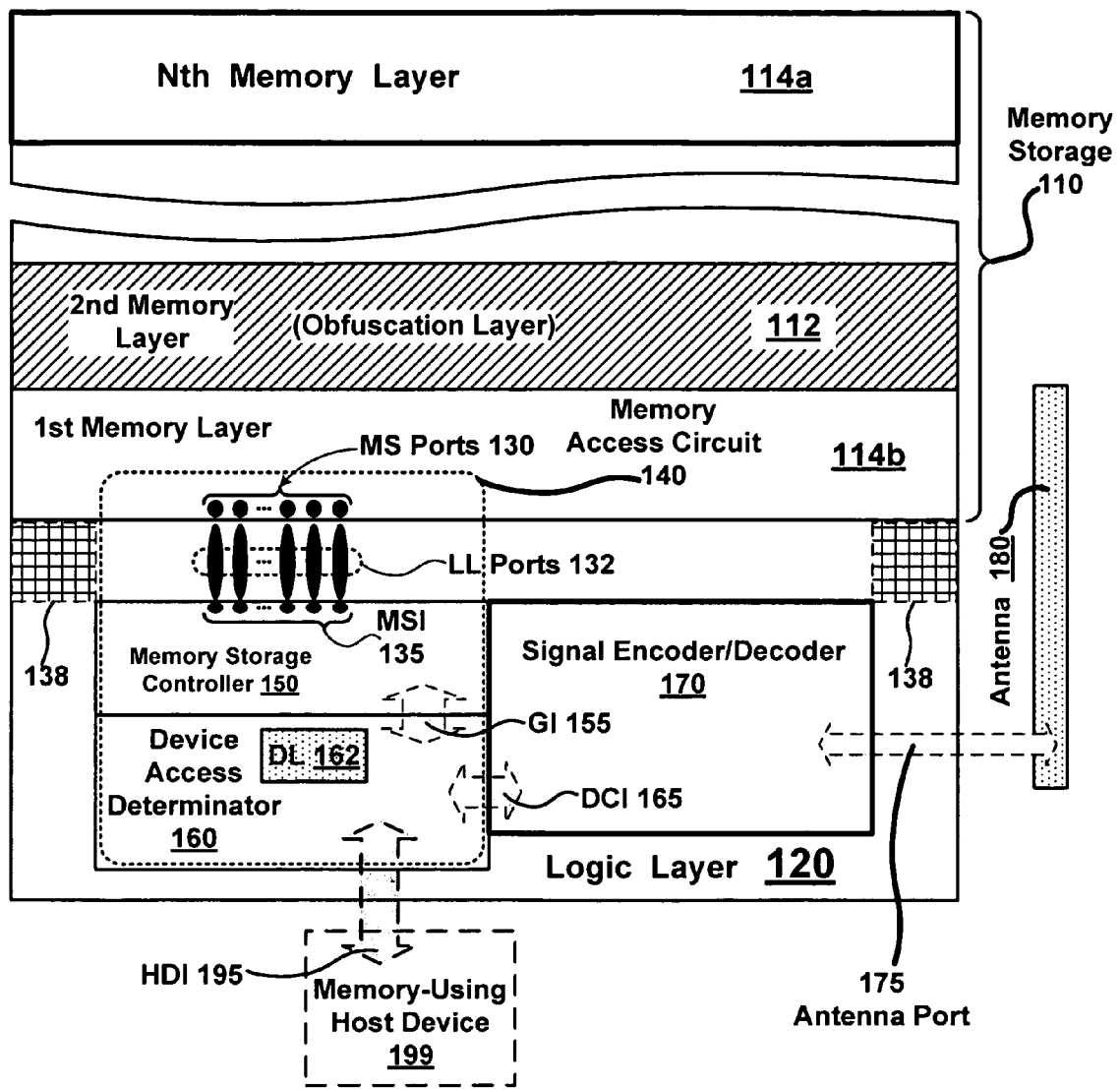
FIG. 1B illustrates a cross-sectional view of another exemplary memory device.

FIG. 1A depicts an example of a memory device 100 configured to protect at least a portion of data stored in the device, according to one or more embodiments. In a specific embodiment, the memory device 100 can include multiple memory storage layers 110 and a logic layer of circuitry 120. While FIG. 1A depicts the multiple memory storage layers 110 as formed upon logic layer 120, the logic layer 120 can be formed separately from the multiple memory storage layers 110 (not shown). At least one of the two or more layers of multiple memory storage layers 110 can be configured as an obfuscation layer 112, which can be configured to conceal or otherwise protect at least a portion of the data (not shown) stored in the multiple memory storage layers 110. Further to the example shown, other layers 114 of the multiple memory storage layers 110 can be implemented to store data without providing for obfuscation-related functionality, as described herein. In at least one other example, other layers 114 can include one or more obfuscation layers 112. The multiple memory storage layers 110 are communicatively coupled (e.g., electrically coupled) via a plurality of ports, such as logic layer ("LL ports") 132 and memory storage ("MS ports") 130, as shown in FIG. 1B, to the logic layer 120. As used herein, the term "upper layer" refers, in at least one embodiment, to a layer that is located and/or formed upon a lower layer, whereby the upper layer can be configured to conceal and/or obfuscate data stored in either the upper or lower layer, or both. As such, the upper layer can be a top or any other layer.

As shown in FIG. 1A, logic layer 120 can include some or all of the logic circuitry for memory device 100. Conceptually, it is convenient to refer to the logic (e.g., logic circuitry and/or active circuitry) for accessing multiple memory storage layers 110 as a logic layer 120; however the logic can be implemented in a variety of different structures, which can, for example, be formed on at least one substrate. In at least one embodiment, multiple memory storage layers 110 can be formed on a first substrate (not shown), and at least a portion of logic layer 120 can be formed on a second substrate (not shown). In some embodiments, the first substrate that includes multiple memory storage layers 110 can also include a portion of logic from logic layer 120, which otherwise can be formed as part of logic layer 120 when multiple memory storage layers 110 are formed thereupon. For example, the portion of logic from logic layer 120 can include address decoders (e.g., row and column decoders), sense amplifier circuits, and other circuitry and logic for effectively exchanging address, control and data information between the first and second substrates. Logic layer 120, in a specific embodiment, can include one or more sets of logic layer ports 132 that communicate power signals, control signals, and data signals to and from the multiple memory storage layers 110 by way of, for example, vias (not shown) formed substantially in the Z (or vertical) direction. In one embodiment, a protective boundary 138 can be formed to surround (or substantially surround) logic layer ports 132 to protect logic layer ports 132 from being electrically probed, tampered with, or otherwise accessed. In some instances, protective boundary 138 can be extended to protect memory access circuit 140, as shown in FIG. 1B.

Memory access circuit 140 can include a memory storage controller 150, which can include circuitry that can be configured to control access to multiple memory storage layers 110. Memory storage controller 150 performs memory control functions similar to many known memory devices, such as a USB memory storage device, a Flash memory card, a random access memory such as a SRAM or DRAM memory device, or the like. For example, when host device 199 (discussed below) transmits write data to memory device 100, memory storage controller 150 can apply the appropriate control signals and data to memory device 100 to select one or more memory cells for storage. Similarly, in serving a read request by host device 199, memory storage controller 150 can be configured to locate the address or addresses for the memory cells that hold the requested data, and can retrieve the stored data to host device 199. Memory storage controller 150 can control access to multiple memory storage layers 110 via at least a subset of logic layer ports 132. Further, memory storage controller 150 can be configured to control access to one or more obfuscation layers 112 via an obfuscation layer ("OL") manager 154, which may or may not take another input from a switch 156. Memory storage controller 150 can control access to other layers 114 via the bus 152. Bus 152 can be formed with a subset of logic layer ports 132 and memory storage ports 130 (FIG. 1B) that can carry both control and data signals.

FIG. 1B shows a cross-sectional view of a memory device 100, according to at least one specific embodiment. In the example shown, multiple memory storage layers 110 can include at least one obfuscation layer 112 above or in between two or more other layers 114 (FIG. 1A). In other examples, memory device 100 can have two or more obfuscation layers 112 that are not next to each other (not shown). FIG. 1B further shows that memory device 100 can include a memory access circuit 140 and a signal encoder/decoder circuit ("signal encoder/decoder") 170, either or both of which can be optional in examples that implement obfuscation layer 112. Memory access circuit 140 can be configured to permit, deny and/or revoke access to memory cells in multiple memory storage layers 110, whereas signal encoder/decoder circuit 170 can be configured to facilitate such access based on transmitted data, such as authorization data.

Each layer of multiple memory storage layers 110 can be accessed via at least a subset of memory storage ports ("MS ports") 130, which are shown as being part of memory access circuit 140. Note that for purposes of clarity, memory storage ports 130 are shown in association with the first memory layer 114b, and are shown to be coupled to the logic layer 120. Memory access circuit 140 can include memory storage controller 150, which, in turn, can include a memory storage interface ("MSI") 135 that couples to at least a subset of logic layer ports 132.

As shown in this example, memory access circuit 140 can include a device access determinator 160. Device access determinator 160 can be configured to act as a gateway to provide memory access circuit 140 with either a structure or the functionality, or both, to permit, deny and/or revoke access via a gateway interface ("GI") 155 between memory storage controller 150 and any external sources of data, such as wireless communication signals and/or host computers. Memory device 100 can also include a host device interface ("HDI") 195 for coupling memory storage controller 150 to a memory-using host device 199, such as a camera, a media player, a wireless phone, a smart phone, a computer, or other types of electronic devices. In various embodiments, host device interface 195 can be implemented to form communication paths with any of the elements of memory device 100.

In at least one embodiment, device access determinator 160 can be configured to grant, deny, and/or revoke access by host device 199 to memory storage controller 150 based on determination logic 162 and one or more signals (or the absence of a signal). In at least one embodiment, device access determinator 160 can be configured to require a password, pass code, or some unique (e.g., secret or otherwise) combination of characters to facilitate communication between host device 199 and memory storage controller 150. As such, device access determinator 160 can be configured to permit, accept, allow, or otherwise admit host device 199 to access multiple memory storage layers 110 to read and write, as well as perform other operations that can modify the contents of multiple memory storage layers 110. In denying access, all or some access by host device 199 can be refused, disallowed, opposed, rejected, repudiated or otherwise ignored. When access by host device 199 is revoked, existing access privilege can be canceled or shutdown, with subsequent access being denied. In one embodiment, device access determinator 160 can be configured to receive the one or more signals through a device communication interface ("DCI") 165. In some implementations, device communication interface 165 can provide a communication path with host device 199 to receive (and/or exchange) signals from either host device 199 or from a source external (not shown) to host device 199, but channeled through host device 199.

In some embodiments, memory device 100 includes a signal encoder/decoder 170 to communicate signals with device access determinator 160 through device communication interface 165. Signal encoder/decoder 170 can be formed in a circuit separate from memory device 100, in a separate chip or substrate implementing memory device 100, or can be built into the logic layer 120. The signal encoder/decoder 170 can be configured to include an antenna port 175 for exchanging signals with an antenna associated with host device 199 (not shown). In other embodiments, memory device 100 also includes an antenna 180 connected to the antenna port 175 to transmit and receive signals external to host device 199. Signal encoder/decoder 170 can be configured to decode signals received through the antenna port 175, and to provide the decoded signals via device communication interface 165 to device access determinator 160. Signal encoder/decoder 170 can be configured to encode signals for transmission in the reverse direction.

FIGS. 1A and 1B depict memory devices with two or more layers of memory storage, according to various embodiments. In some embodiments, each memory cell of multiple memory storage layers 110 can include a two-terminal memory element as was described above. In yet another embodiment each memory cell of the multiple memory storage layers 110 can include a three-terminal element, such as a memory element in a Flash memory device or SRAM memory device. Where areal density and/or data storage density are paramount, a two-terminal memory element is preferable because it requires fewer routing resources to interconnect its two terminals and therefore uses less area than a three-terminal memory element.

As used herein, the term "memory device" refers, in at least one embodiment, to a device that provides memory or data storage in any form or structure. Memory storage of a memory device can be single-layered or multiple-layered memory in the form of one or more integrated circuit ("IC") chips. As such, a memory device including memory storage and access circuitry can be in the form of one or more integrated circuit chips. Further, the term "memory device" also can refer to a semiconductor board, a memory stick, a pen, a cube, a plug-in card, or a memory card, such as that of a known Flash memory card or SRAM memory card. A memory device can also be any device, including a portable media player, a personal digital assistant (PDA), a cellular phone, a portable computing device, or the like, that secures data and grants access to stored data in a manner according to various embodiments of the invention.

While FIGS. 1A and 1B show that memory device 100 can be formed in, for example, a single semiconductor package in the form of an integrated circuit ("IC") chip, parts of the memory device 100 can be formed in separate semiconductor packages. For example, multiple memory storage layers 110 can be formed in one or more multiple-layered memory chips. Signal encoder/decoder 170 can be formed in a chip by itself or combined with other parts of memory device 100. Memory access circuit 140, which can include memory storage controller 150 and device access determinator 160, can be implemented in one or more chips or combined with other parts of memory device 100, for example, in combination with part or all of multiple memory storage layers 110.

FIGS. 1A and 1B show that memory device 100 includes one or more layers of multiple memory storage layers 110 implemented as obfuscation layers 112. An obfuscation layer 112 can be configured to provide hardware protection—in whole or in part—to one or more layers below obfuscation layer 112. In the event that a memory device 100 is removed from, or otherwise is exposed within its housing enclosure (e.g., a semiconductor package), obfuscation layer 112 can obstruct physical access to the memory cells on the layers below. As used herein, the term "obfuscation" in the context of a memory storage layer refers, in at least one embodiment, to a memory storage layer configured to prevent access to (or otherwise determine) at least a portion of data stored either in that memory storage layer, or any memory storage layers below. For example, obfuscation layer 112 can be configured to block electrical probing of the lower layers semiconductor wafer. In one embodiment, obfuscation layer 112 itself can be configured to store non-critical data. In alternative embodiments, obfuscation layer 112 can be configured to store no data. In a specific embodiment, obfuscation layer 112 is disabled and can be configured to be inaccessible to store data. As used herein, the term "disabled" with respect to an obfuscation layer refers, in at least one embodiment, to the obfuscation layer being configured to not function as a layer of memory storage. As such, probing of the memory cells can not yield data. The configuration of obfuscation layer 112 can be done at manufacturing, or, in some instances, can be performed by user of a memory device 100, for example, in the form of a jumper (not shown) or switch 156. Switch 156 and other equivalent input devices are described below.

In addition to being able to block physical access to other layers 114 of multiple memory storage layers 110, an obfuscation layer 112 can be configured to "conceal" data. As used herein, the term "conceal" refers, in at least one embodiment, to one or more manipulating measures performed on data or other objects to hide the data or objects from unauthorized access or hide the true nature of the data or objects to reduce their value. For example, obfuscation layer manager 154 can be configured to encrypt data (or a portion thereof) before storing the data in obfuscation level 112. As such, an unauthorized user can extract unintelligible content by probing the encrypted data. In the alternative, or in addition, memory storage controller 150 can be configured to break up a piece of data into data components and store a part of the piece of data in obfuscation layer 112. For example, memory storage controller 150 can be configured to split up a byte of data into eight bits and store one bit (or up to seven bits) in the obfuscation layer 112. The remainder of the other bits can be stored in the non-obfuscation layers, such as any of other layers 114. In some embodiments, data destined for other layers 114 can be written or read through bus 152 without any concealment manipulations.

In operation, data stored in memory device 100 can be accessed through memory storage controller 150. For example, when obfuscation layer 112 stores encrypted data, obfuscation layer manager 154 can be configured to decrypt the data before sending the data, through memory access circuit 140, to the requesting host device 199. In the reverse direction, obfuscation layer manager 154 can be configured to encrypt data from host device 199 for storage in obfuscation layer 112. Further, if obfuscation layer 112 can be configured to store incomplete data (e.g., portions of data as data components, such as one bit of a byte), obfuscation layer manager 154, on read requests, can be configured to reconstruct the complete data by combining the separately stored data bits from both obfuscation layer 112 and other layers 114 before sending the data to host device 199. In the reverse direction, obfuscation layer manager 154, on write requests, can be configured to split data from host device 199 for storage in both obfuscation layer 112 and other layers 114. The keys used in encryption/decryption and the formulas used in partitioning/reconstructing data can be programmed into the memory access circuit 140. Examples of such keys include private and public keys used in known encryption/decryption techniques. A memory device 100 can be configured to store keys and formulas in an obfuscation layer 112, another part of memory access circuit 140, or anywhere else in memory device 100, such as in other layers 114. In an alternative embodiment, the keys and formulas can be stored in a secured portion of the multiple memory storage layers 110, such as in another layer 114 that is below an obfuscation layer 112. If contents of obfuscation layer 112 are extracted by force or other unauthorized means other than through the memory storage controller 150, the extracted incomplete or encrypted data can be less useful to the extractor.

Obfuscation layer manager 154 can be configured to manage and control obfuscation layer 112. For example, obfuscation layer manager 154 can be configured to conceal data stored in obfuscation layer 112 or disable obfuscation layer 112 as a storage layer. The functions performed by obfuscation layer manager 154 can be programmed into the memory access circuit, or be left as selection choices for the user of the memory device to make. In the latter, memory device 100 can include a switch 156 or other selection means such as a jumper port, a toggle button, a pin-size contact button, or other mechanical or electromechanical switches. In some embodiments, switch 156 can be an electronic switch, such as a transistor, a pass gate, a register storing one or more data bits, or the like. The above-described mechanical and electronic switches can be referred to as a switch. A switch may have one or more positions. Data representing the switch positions can be programmed into memory device 100 to implement different security measures to suit a variety of applications. For example, one or more positions of switch 156, when selected, can be configured to cause either obfuscation layer manager 154 or memory storage controller 150, or both, to: (1) store no data into the obfuscation layer, (2) store encrypted data, (3), store partial data, or (4) perform any other data concealing methods. In some embodiments, memory device 100, can be configured to detect a switch position that signals the memory device 100 to erase data in obfuscation layers 112 and/or other layers 114 when, for example, power is removed from memory device 100. Therefore, if the communication link between memory device 100 and host device 199 is broken or power is removed from memory device 100, obfuscation layers 112 and/or other layers 114 can be erased to prevent unauthorized removal of memory device 100 from its operational environment.

In some embodiments, device access determinator 160 can be configured to guard memory device 100. In operation, device access determinator 160 can grant, deny, and/or revoke access by host device 199 under different conditions in which different security measures can be implemented to guard against unauthorized access of data stored in memory device 100. The conditions for access or revocation of access depend on the combinations of determination logic 162 and signals received though the device access interface 165. For example, in one embodiment, the desired level of security is to protect data stored in a memory device 100 from unauthorized access. In this embodiment, determination logic 162 can simply detect a signal that authorizes access to the memory device 100. As such, absence of the signal can cause revocation of the access and/or denial of subsequent access. In some embodiments, access condition may require a password.

In various embodiments, determination logic 162 can be formed as an integrated circuit or can be implemented as executable instructions (e.g., computer readable code) programmed into, for example, memory access circuit 140, or determination logic 162 can be any combination of circuitry and executable instructions. In at least one embodiment, determination logic 162 can either include authorization data and/or instructions, or can be configured to access any portion of multiple memory storage layers 110 that stores either authorization data or instructions, which when executed, determines a location at which memory device 100 is authorized to operate. In some embodiments, determination logic 162 includes proximity data (not shown) that specifies geographical information. To illustrate, consider that the proximity data can include data representing longitude and latitude coordinates identifying a specific location on earth, such as given by a Global Positioning System ("GPS"). Further, the proximity data can include altitude data specifying an altitude of, for example, 30 feet above sea level, 20 meters from street level, or the fifth floor of a building. Note that in at least one embodiment, memory device 100 can reside within (e.g., embedded in) host device 199 to control access to the contents or a portion of the contents stored in host device 199, as a function of, for example, an activation signal and/or the geographical location of the host device 199.

Figure 1C:
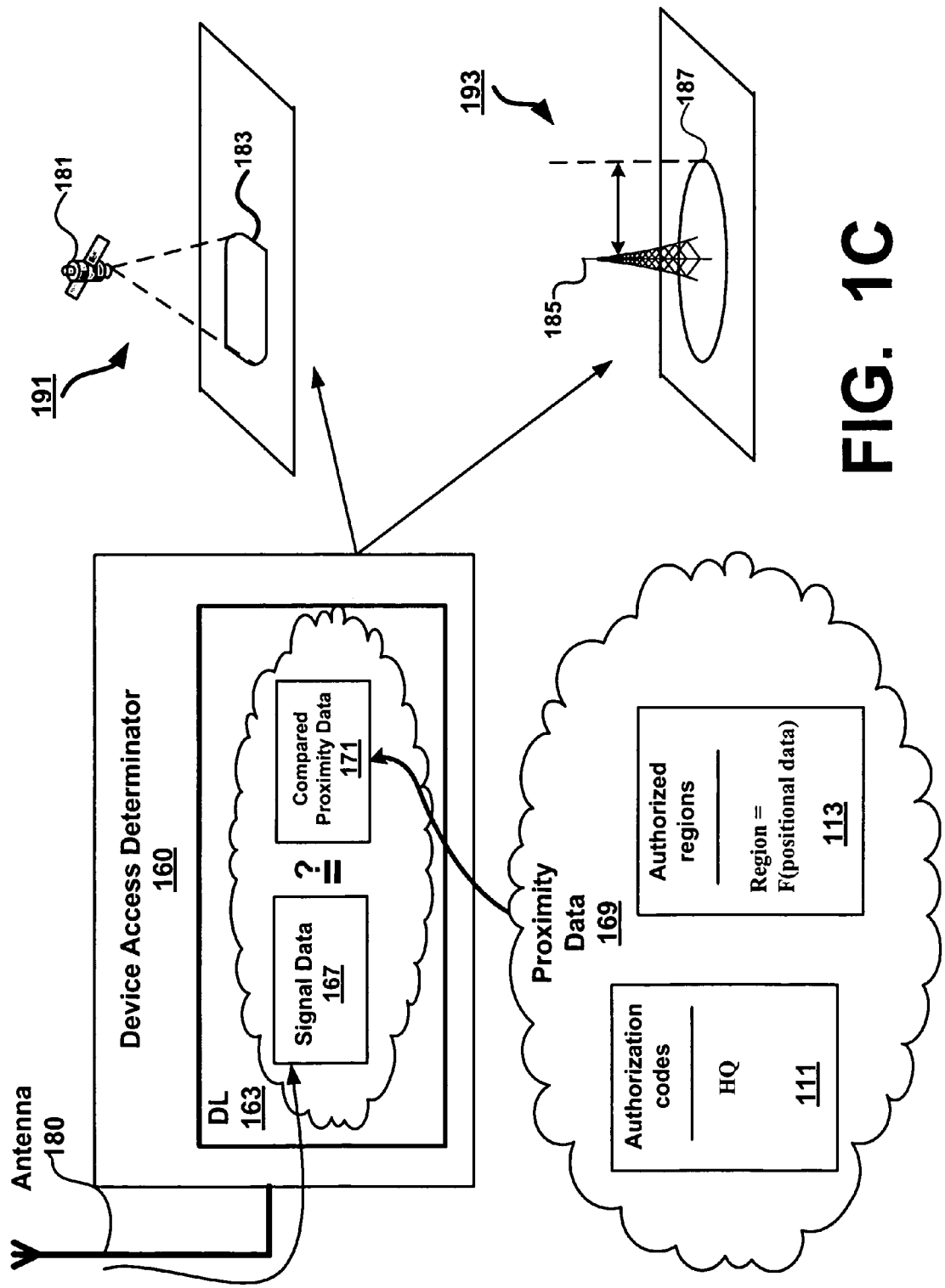
FIG. 1C illustrates on example of securing access to a memory device implementing a device access determinator.

FIG. 1C illustrates one example of securing access to a memory device implementing a device access determinator, according to an embodiment of the invention. As shown, device access determinator 160 can include determinator logic ("DL") 163 configured to determine whether to provide access to multiple memory storage layers 110. In operation, determinator logic 163 can be configured to receive signal data 167 from external sources via antenna 180. Signal data 167 from an activation signal can include data that represents an authorization code, for example. Further, determinator logic 163 can fetch proximity data 169, such as an authorization code 111, for comparison purposes as compared proximity data 171. Then, determinator logic 163 can compare whether signal data 167 is associated with compared proximity data 171, whereby a valid comparison (i.e., a match) can result in determinator logic 163 granting access. If there is a match, determinator logic 163 permits a memory device 100 to provide access within a signal range 187 as shown in one authorization scheme 193. As such, a signal source 185 transmits an authorization code 111, such as HQ, and in response, memory device 100, if it is within signal range 187, can receive and match proximity data to provide memory access. If memory device 100 is located outside signal range 187, then access is either denied or revoked. As used herein, the term "proximity data" refers, at least in one embodiment, to data that is used to determine whether access is permitted or is prohibited. For example, proximity data can include positioning information (i.e., positional data as discussed below) from which a geographical location can be determined, an authorization code, or any other data that can determine authorized access to a memory device.

In other embodiments, signal data 167 can include data representing positioning information, such as data from a GPS signal, to determine the location of memory device 100 (FIGS. 1A and 1B). As used herein, the term "positional data" refers, at least in one embodiment, to data representing positioning information from which a geographical location can be determined (e.g., in terms of a specific point or geographic region). Determinator logic 163 can fetch proximity data 169, such as data representing an authorized region 113, as compared proximity data 171. Such data can be a function of one or more GPS coordinates. Then, determinator logic 163 can compare whether signal data 167 is associated with compared proximity data 171, such as data representing a geographical position, location, and/or region as a function of one or more GPS coordinates (e.g., Region=F(positional data)), whereby a valid comparison can result in determinator logic 163 providing access. If there is a match, determinator logic 163 permits a memory device 100 to provide access within an authorized region 183, as shown in another authorization scheme 191. As such, a signal source 181 can transmit positional data, and memory device 100, if it is within authorized region 183, can receive and match the positional data (as Signal Data 167) to proximity data 169 for providing memory access. If memory device 100 is located outside authorized region 183, then access is either denied or revoked.

In other embodiments, referring back to FIGS. 1A and 1B, determination logic 162 can implement proximity data representing authorization codes for a variety of locations. For example, a company with multiple locations can choose to represent each of the company's locations with a data value (e.g., representing coordinates, an authorization code, or the like), such as "HQ" to represent the location of the company's headquarters, "loc-8" for the company's sole sale building, "xyz" for the company's manufacturing floor, "1293" for the company's research and development campus, and "L99" for the company's highly-secured computer room. In this specific example, determination logic 162 and/or the proximity data can include data representing "HQ," "loc-8," "xyz," "1292," and "L99." In other embodiments, determination logic 162 includes instructions to fetch proximity data from a portion of memory storage, such as a portion of an obfuscation layer 112 or other layers 114. In some embodiments, determination logic 162 and/or the data values used by determination logic 162 can provide for another access authorization scheme. For example, determination logic 162 can be configured to determine different security clearance levels and device access determinator grants and/or revoke access to memory devices 100 based on the different security clearance levels.

In various embodiments, determination logic 162 can be implemented to provide authorized access, explicitly block access, or a combination of both. As such, the proximity data can include proximity data for either authorizing or blocking access in association with data representing any of the following locations: "HQ," "loc-8," "xyz," "1292," and "L99." In one embodiment, the proximity data can include regional data that represents, for example, four corners of a region represented by four pairs of GPS coordinates. Other regional representations include marking the boundary of a region by three or more points, or specifying the area of a region, such as an area covered by a certain radius from one or more points. As such, determination logic 162 can be configured to determine a geographical location defined, for example, by GPS coordinates, and can further be configured to determine whether the geographical location is within a region. If so, determination logic 162 can communicate the condition that memory device 100 is within an authorized location or region and memory storage controller 150 can be configured to either permit or deny access.

In another embodiment, after access has been granted, determination logic 162 can be configured to determine whether an activation signal, for example, is detected during an interval of time. For example, memory device 100 can be configured to provide access to memory storage layers 110 so long as memory device 100 is in range (i.e., within a certain proximity) so that determination logic 162 can receive an activation signal. When memory device 100 is within such a range, determination logic 162 can be configured to match an authorization code (e.g., stored as the proximity data) with an activation signal that includes signal data (e.g., representing the authorization code). So long as there is a match, memory device 100 provide access, otherwise access is blocked. Many other access authorization schemes are possible with various embodiments of the invention.

Figure 4:
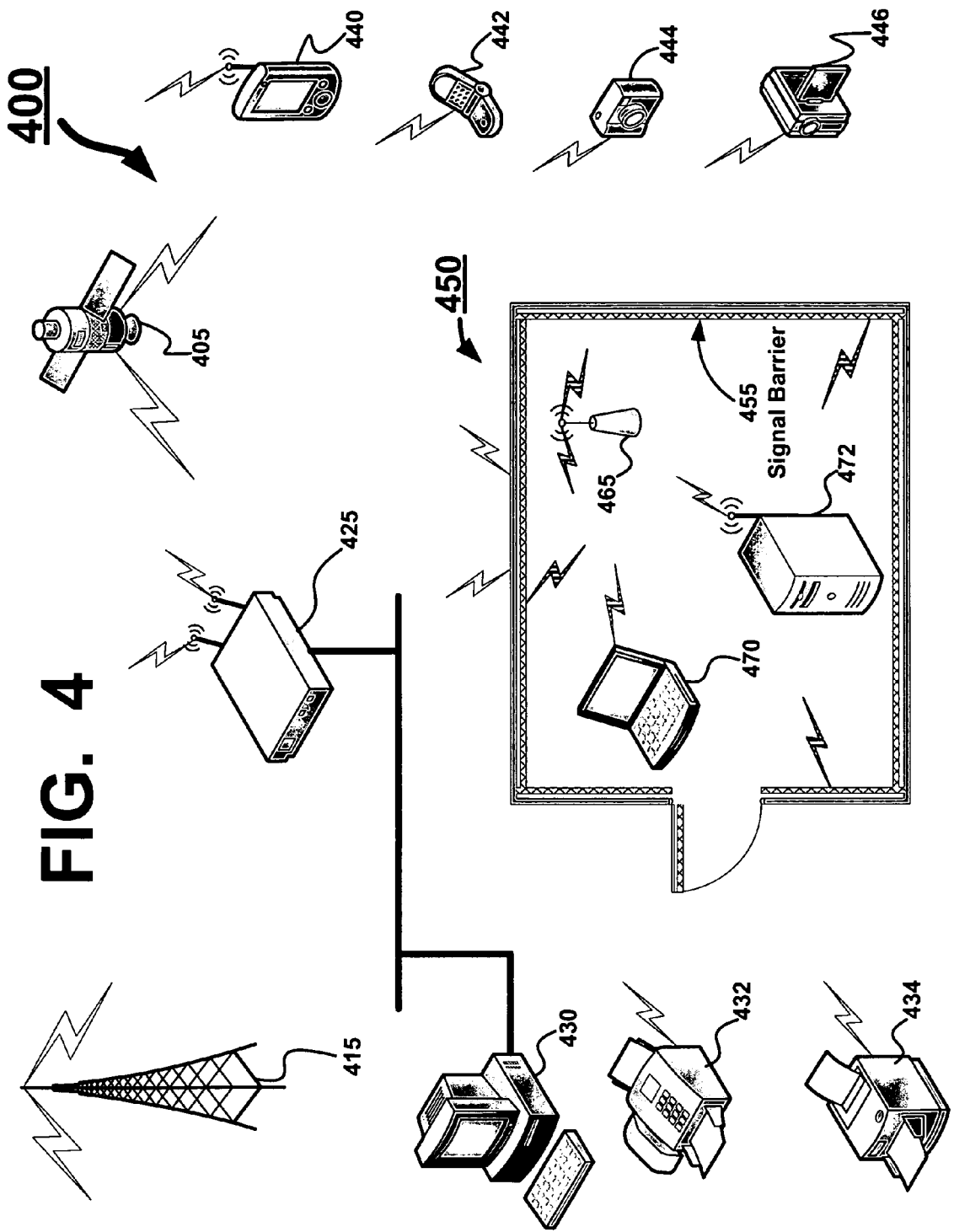
FIG. 4 illustrates an exemplary memory system where data in memory storage is secured.

Device access determinator 160 can be configured to receive signals through device communication interface 165. In some implementations, memory device 100 can be embedded in host device 199, which can also provides the activation signal and/or a signal including data representing the geographical location. Host device 199 can include an antenna (not shown) and signal encoder/decoder (not shown) to communicate signals with an external source, and to exchange the signals (e.g., an activation signal and/or a signal including data representing the geographical location) to and from device access determinator 160. In other implementations, host device 199 can communicate with a signal source via a wired connection, such as shown in FIG. 4. In some embodiments, memory device 100 includes signal encoder/decoder 170 and antenna 180. In various embodiments, memory device 100 can be configured to connect to an antenna of a host device. If signal communication does not require an antenna, such as infrared communication, antenna 180 may not be required.

A signal, as known in the art, can be any signal, digital or analog. A signal can be carried by a wire made of any medium capable of carrying a signal such as copper, aluminum, gold, and fiber optic. A signal can be communicated wirelessly, carried in light waves or the waves of the electromagnetic spectrum such as radio waves, microwaves, and infrared waves. A signal can be encoded in any communication protocols such as GPS, Bluetooth®, WiFi, WiMax, Cellular, Time Division Multiple Access (TDMA), Code-Division Multiple Access (CDMA), Global System for Mobile Communication (GSM), Personal Digital Cellular (PDC), and General Packet Radio Service (GPRS). A GPS signal, depending on the context and use, can refer to a signal from a GPS satellite, such as a signal received at an antenna on memory device 100 or host device 199. A GPS signal received by device access determinator 160 refers to the latitude/longitude coordinate pair that is usually the computation output of more than one GPS satellite transmission.

Device access determinator ("DAD") 160 can be configured to control access from host device 199 to memory device 100, according to the operation of determination logic 162 and the signals that determination logic 162 either receives or does not receive. For example, determination logic 162 can include proximity data including data representing a list of authorized access locations: "HQ," "loc-8," and "xyz." If device access determinator 160 receives a signal representing the value "loc-8," then device access determinator 160 can grant host device 199 access to the memory storage controller 150, thereby granting access to multiple memory storage layers 110. If device access determinator 160 receives a signal that does not match one on the authorized list, for example, a signal with the value of "L99," device access determinator 160 can be configured to deny host device 199 access to memory storage controller 150. But if the host device 199 already has access, device access determinator 160 can revoke that access.

In some embodiments, the proximity data comprises data representing geographical locations expressed in terms of GPS coordinate pairs, which, in turn, can represent a certain work location, the user's home location, or a visiting office location. If device access determinator 160 receives a signal that represents any of these authorized locations, access to memory device 100 can be granted. If a signal is absent or does not include data representing any of the authorized locations, such as, for example, a GPS signal including data representing a location for an airport, no access can be granted. In one embodiment, any existing, previously-granted access can be revoked.

Figure 2:
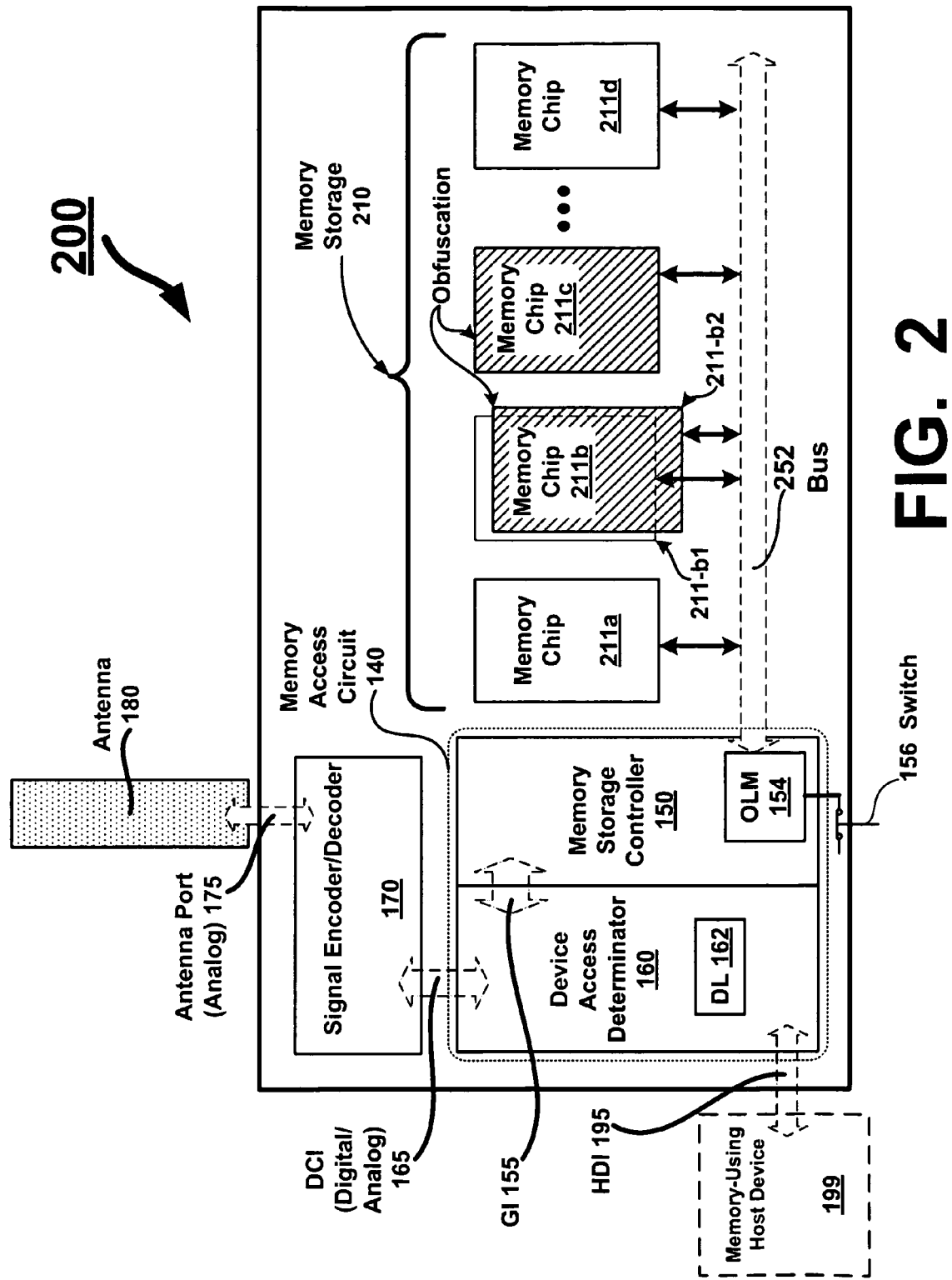
FIG. 2 illustrates another alternative exemplary memory device that can be implemented with non-layered memory.

FIG. 2 depicts a memory device implementing one or more single-layered memory integrated circuits, according to at least one embodiment. Memory device 200 includes memory storage 210 and memory access circuit 140. In some embodiments, memory device 200 can also include a signal encoder/decoder 170. In at least one embodiment, memory device 200 further includes an antenna 180.

Memory storage 210 can be formed in association with a single integrated circuit chip, or more than one chip. Each chip can be formed with a single layer or multiple layers of memory cells. In some embodiments, memory storage 210 includes two or more memory chips. FIG. 2 illustrates that memory storage 210 can include at least four memory chips 211a, 211b, 211c, and 211d. Memory chips 211a, 211c, and 211d, each contains a single layer of memory cells. Memory chip 211b includes multiple layers of memory cells, including layer 211-b1 and layer 211-b2. Any layer of any memory chip can be configured to perform the obfuscation function as described in FIGS. 1A and 1B. For example, the single layer of memory chip 211c can be configured to conceal data stored in that chip, such as by storing encrypted data or partial data therein. In one embodiment, layer 211-b2 of memory chip 211b can be configured to operate as an obfuscation layer, which obstructs physical access (e.g., electrically probing the semiconductor die) to the layers below, such as layer 211-b1.

In another embodiment, one memory chip can constitute memory storage 210. As such, the memory chip can be formed as a single-layer of memory cells or the chip can be formed as two or more layers of memory cells. In at least one embodiment, a single-layer memory chip can include at least a portion of the memory access circuit 140. In at least one implementation, a single-layer memory chip includes at least a portion of memory access circuit 140, and the chip can further include signal encoder/decoder 170, which can be configured to transmit and/or receive radio signals via antenna port 175 with antenna 180. In some embodiments, signal encoder/decoder 170 can be configured to communicate digital signals with device access determinator 160 via device communication interface 165. In at least one embodiment, signal encoder/decoder 170 communicates analog signals with device access determinator 160 via device communication interface 165.

Memory storage 210 can be communicatively coupled to memory access circuit 140 via bus 252, which can be configured to carry control signals and data signals. Memory access circuit 140 includes at least a memory storage controller 150 and a device access determinator 160. In some embodiments, memory storage controller 150 can include an obfuscation layer manager ("OLM") 154, which can be configured to communicate with either obfuscation layer 211-b2 or the obfuscation layer in chip 211c, or both, via bus 252 or via a different bus (not shown).

In some embodiments, memory storage controller 150, device access determinator 160, and signal encoder/decoder 170 each can be formed in a separate chip. In other embodiments, one chip can be configured to include any combination of one or more of the following: memory storage controller 150, device access determinator 160, and signal encoder/decoder 170. For example, a single chip may contain both memory storage controller 150 and device access determinator 160; or both memory storage controller 150, and signal encoder/decoder 170; or both device access determinator 160 and signal encoder/decoder 170; or all three memory storage controller 150, device access determinator 160, and signal encoder/decoder.

Figure 3:
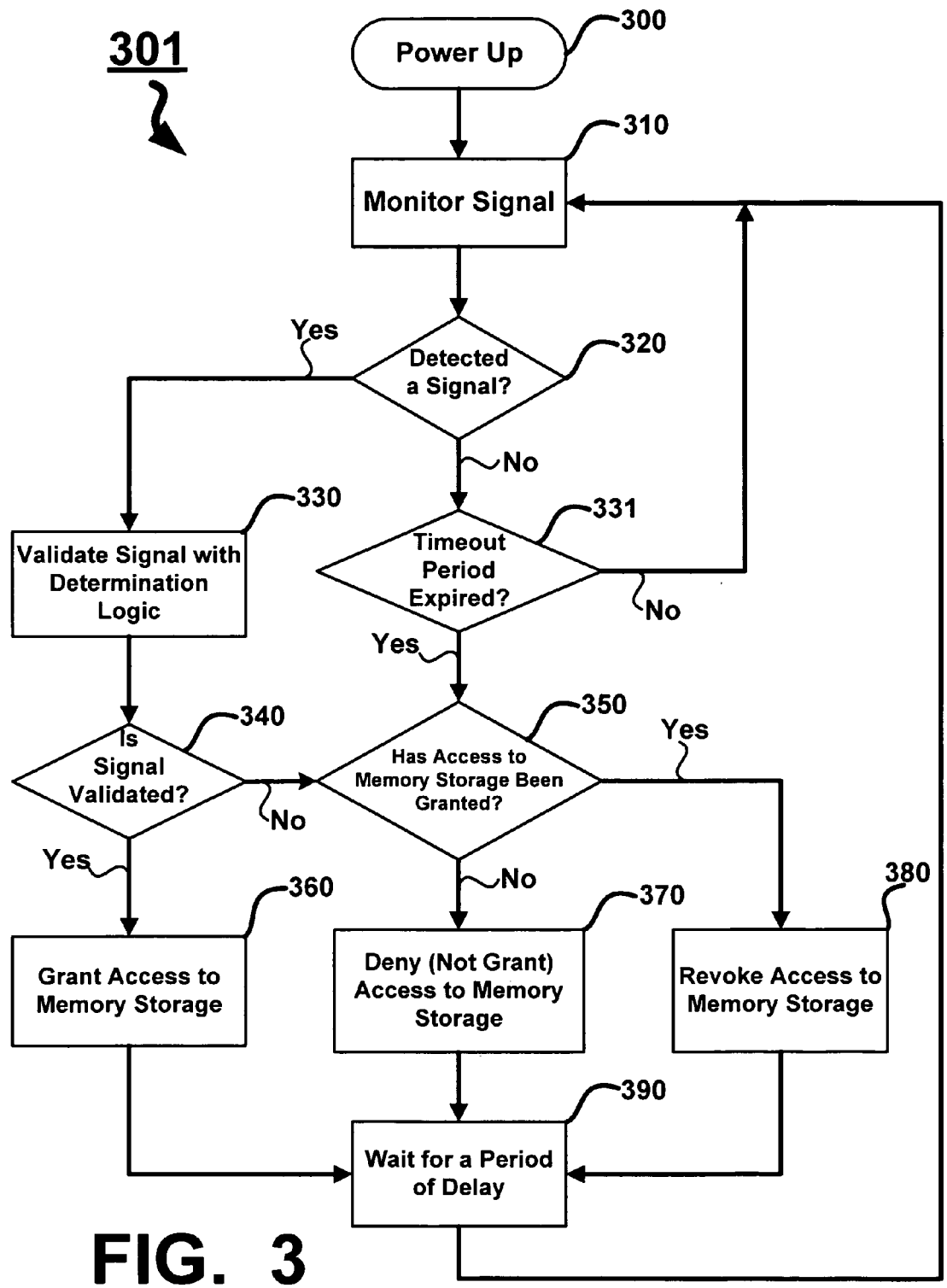
FIG. 3 is a flow chart illustrating an exemplary method of securing data in memory storage.

FIG. 3 is a flow diagram 301 depicting an example of a method for securing data, according to at least one embodiment. In some embodiments, a method performs a subset of flow diagram 301 and can perform one or more functions, each of which is not shown in FIG. 3 to avoid unnecessarily obscuring the description. Note that flow diagram 301 and its constituent elements can be performed by a memory device, a device access determinator, or any device implementing or mimicking a memory device, such as an electronic device or a computer program executing instructions to secure stored information or database. On power up at a stage 300, a memory device monitors whether a specific signal or data is received. The term "power up" can refer to a condition in which power applied to the memory device can be sufficient to operate the memory device. For example, when the memory device is attached to a host device, power up at the stage 300 can occur when the host device starts powering up, or when the host device is awakened from hibernation or sleep. At a stage 310, when the memory device is monitoring for a signal, the memory device can be in one of three states: (1) a host device has not been granted access to the memory storage of the memory device, (2) a host device has been previously granted access, but the access to the memory storage of the memory device has been revoked, and (3) the host device has been granted access to the memory storage of the memory device.

In states (1) and (2), the host device has yet to gain access to the memory storage of the memory device. In this case, a memory device, specifically the device access determinator of the memory device, monitors 310 to detect a signal that the device access determinator can be configured to recognize. The signal can come from any signaling source, such as those shown in a system of FIG. 4. In some embodiments, the device access determinator can be configured to detect a GPS signal at a stage 320. In other embodiments, the device access determinator can be configured to detect a signal at 320 in another format, in addition to, or instead of the GPS format. In one embodiment, the signal can be in a format that includes authorization data, that if not received during a period of time, the flow diagram 301 revokes any previously granted access.

If the device access determinator detects or receives a signal at a stage 320, then the device access determinator attempts to validate the received signal at a stage 330 using the determination logic. In one embodiment, the determination logic can be configured to determine whether a detected signal and/or data embodied in the signal either provides for or denies access to the memory in the memory device. In one instance, the determination logic can be configured to access proximity data representing authorized geographical locations and/or regions in which the memory is accessible. Then, the determination logic can compare the proximity data to either data representing the GPS coordinates from the detected signal, or an activation signal that permits continued access for a duration of time set by, for example, the delay period at a stage 390. If the determination logic determines that the detected signal and/or data embodied in the signal matches the proximity data, then the validation is successful at a stage 340, and the device access determinator grants the host device access to the memory storage of the memory device at a stage 360. In some embodiments, the memory device can be configured to further require a password before access is granted. If the validation fails at the stage 340, then the device access determinator goes through stages 350, 370, and 390 before resuming monitoring 310 for a specific signal. After the flow diagram 301 passes through stages 360, 370, or 380, then flow diagram 301 continues to the stage 390. The device access determinator, then, can wait for a period of time delay at the stage 390 before resuming monitoring 310 for the specific signal. In some embodiments, the delay period is programmed into the memory device, and may or may not be reprogrammable. In other embodiments, the memory device can be configured to allow the user to change the delay period, for example, after the host device gains access to the memory device.

In some embodiments, signal validation includes additional "hand shaking" functions. For example, after successfully validating a first received signal, the device access determinator can be configured to broadcast a second signal to solicit receipt of a third signal in, for example, a particular format and/or with a specific value. After the device access determinator receives the expected third signal, the device access determinator can grant the host device access to the memory storage of the memory device. In other embodiments, the device access determinator can be configured to monitor signals to detect a fourth signal, send a fifth signal, etc. In one specific embodiment, the device access determinator can be configured to perform a calculation during the validation at the stage 330. For example, the device access determinator receives a first signal, in the form of a polynomial. The device access determinator then can send a second signal derived from the polynomial and listen for a third signal that represents a second polynomial. The granting of access can be configured to happen after the second polynomial, after the third polynomial, or after any sequence of polynomials. A signal or a sequence of signals that leads to successful validation can be described herein as an "activation signal," at least in one embodiment. A signaling source can be configured to send one or more signals, which can be intended for a particular memory device. For example, a signaling source can transmit a unique identifier via a signal, such as an activation signal, whereby the unique identifier identifies a memory device in the system. The unique identifier can be a Universally Unique Identifier ("UUID"), a Media Access Control ("MAC") address, a serial number, or any identifier capable to address one memory device in a system. In a specific embodiment, the memory device can receive an access activation signal after the memory device successfully communicates and processes, for example, a sequence of polynomials, or other "hand shaking" signals.

After access to the memory storage of the memory device is granted at the stage 360, the device access determinator can be configured to send an acknowledgment signal (not shown), whereby an acknowledgment signal can be configured to notify a signaling source in the system that access has been accepted. In some embodiments, if the acknowledgment signal is not received by a signaling source of the system within a period of time, one or more signaling sources can be configured to send an alert signal, as well as a revocation signal that revokes authorization to access the memory. In some instances, the alert signal is configured to notify an authority that a memory device might be operating in a manner that does not comply with a security protocol (e.g., that defines conditions in which memory can be accessed). In other embodiments, no acknowledgment signal is required. Some embodiments can employ additional or alternative signaling requirements, such as requiring a memory device to send a "new location" signal when the geographical location of the memory device has changed. Alternatively, a memory device can be configured to broadcast (e.g., periodically) an "I am alive" signal, which signifies that the particular memory device is operational, and, optionally, is operating in compliance with its security protocol. In one embodiment, a memory device can activate a shutdown process that shuts down the memory device or revokes its memory access, for example, after receiving a shutdown signal.

When a host device has been granted access to the memory device, at state (3), the device access determinator can be configured to quit monitoring signals. In some embodiments, the device access determinator can be configured to monitor and process signals to allow the host device to maintain access to the memory storage. Before a timeout period expires at a stage 331, if a recognized signal is detected at the stage 320, and validated at stages 330 and 340, then the device access determinator can be configured to continuously grant access to the memory storage at the stage 360. If, however, the detected signal fails validation at the stage 340, then the previously-granted access (e.g., in state 3) can be revoked at the stage 380.

Revocation can also occur if no recognizable signal is detected within the allowable time period set forth in the stage 390. For example, consider that flow diagram 301 has previously validated a signal at the stage 340 to grant access at the stage 360. Then the device access determinator can continue to monitor signals at the stage 310 until a timeout period is expired at the stage 331. In one embodiment, if a memory device is moved beyond a signal range to receive an activation signal (e.g., a signal that includes an authorization code) that, for example, is transmitted periodically, then the memory device implementing a device access determinator can fail to receive such an activation signal. Loss of signal causes loss of access, and, as such, the signal range demarcates, in this example, an authorized region of operation. In another embodiment, if the memory device is moved beyond an authorized location (e.g., a geographical location and/or region) that is associated with an activation signal (e.g., a signal that includes data representing positioning information to determine the location of the memory device, such as a GPS signal), then the memory device implementing a device access determinator can determine that the location is either valid or invalid. An invalid GPS signal causes loss of access, and, as such, the geographical range defined by GPS coordinates can demarcate, in this example, an authorized region of operation.

In some embodiments, the device access determinator can be configured to receive a revocation and/or shutdown signal to revoke access (not shown), in addition to receiving a signal or a sequence of signals that provide an activation signal to grant access. As such, once a host device gains access to the memory storage at the stage 360, the host device can maintain such access so long as the device access determinator can detect an activation signal before a timeout period expires, and the device access determinator does not detect a shutdown signal. Otherwise, any existent access can be revoked and/or further requests for access can be denied.

In some embodiments, the device access determinator can be configured to send a revocation notification signal (not shown) to notify the system that access has been revoked. In other embodiments, revocation notification signal need not be sent.

In at least one embodiment, the device access determinator can be configured to communicate with signaling sources that are passive ("passive signaling sources"). In particular, passive signaling sources are configured to transmit activation signals in response to a power-up notification signal. As such, the device access determinator can be configured to send a power-up notification (not shown) after a memory device is powered up at the stage 300 (e.g., before the monitoring for signals at the stage 310). Sending a power-up notification allows the device access determinator to "wake up" a passive signaling source, which does not actively send activation signals.

FIG. 4 depicts a system for securing data, according to various embodiments. Alternative embodiments can incorporate any subset of the components of system a 400. Some embodiments may include additional or fewer components.

The system 400 for securing data includes at least one signaling source, such as source 415, and at least one memory device, which is attached to a host device. FIG. 4 shows four exemplary signaling sources: satellite 405, radio tower 415, and electronic device 425, such as a wireless access point or router, and a structure capable of communicating signals 465. A signaling source can be of any type, size, configuration, and structure. For example, a signaling source can be a hand-held key fob (not shown). In some embodiments, a signaling source can be configured to communicate signals wirelessly, through a wired connection, or both, such as signaling source 425. In some embodiments, a system includes one or two signaling sources. In other embodiments, a system may have tens or hundreds of signaling sources. In a system that support many host devices, there may be thousands or more of signaling sources.

A system can regulate access to any number of memory devices. A memory device provides memory storage for a host device, and system 400 can include any number of host devices of any types. Any device that is capable of using a memory device, such as described herein, can be viewed as a host device. For example, a host device can be a computing device, such as a hand-held computer, laptop, desktop, or mainframe system; an electronic device, such as a disk drive, music server, video server, network access storage, network or wireless access point, network router, or network gateway; a consumer electronic device, such as a personal digital assistant (PDA), smart phone, cellular phone, general purpose phone, camera, video recording device, television, radio, audio system, or game console; or a vehicle, such as an automobile, boat, ship, airplane, train, or a personal transporter. System 400 in FIG. 4 shows nine host devices: computer 430, facsimile machine 432, printer 434, PDA 440, cellular phone 442, camera 444, video recording device 446, laptop computer 470 and server 472. Each host device can include one or more memory devices, either embedded in the host device or attached to the host device. To communicate signals wirelessly, a memory device can be configured to include an antenna, according to at least one embodiment. In other embodiments, other memory devices can be configured to utilize a host's antenna. A host, such as computer 430, can be configured to communicate signals through a wired connection, such as a network connection, USB, IEEE 1394, etc.

In some embodiment, system 400 supports one or two devices. In other embodiments, system 400 may include tens, hundreds, or even thousands of devices. In large scale embodiments, such as a cellular network, system 400 may support hundred thousands, millions, hundred millions or more devices.

In some embodiments, system 400 can be configured to support one zone. All memory devices in the zone implement the same activation or deactivation signals. In some embodiments, a system can be configured to implement two or more zones, for example a research and development ("R&D") zone and a sales zone. Memory devices in different zones can implement different activation and deactivation signals. For example, a signaling source in the R&D zone communicates signals that activates or deactivates memory device configured to be used in that zone. A host device with a memory device that can be configured to be used in the sales zone, therefore, can be configured to not gain access to the memory device inside the R&D zone. A system with two or more zones can be configured to support overlapping zones, as depicted in FIG. 4.

In an embodiment, an enclosed area, depicted as room 450, as a sub-system, contains at least a signaling source 465 and two host devices 470 and 472. Room 450 includes a signal barrier 455 that block signals traveling through the walls and door of room 450. In this specific embodiment, activation signals sent by signaling source 465 are blocked by signal barrier 455, which prevent the activation signals from being received outside room 450. For example, a memory device can be attached to or embedded in laptop 470. The memory device in laptop 470 can be configured to grant access to laptop 470 in room 450. If laptop 470 is shutdown in room 450 and then is powered up again outside room 450, signal barrier 455 prevents the memory device in laptop 470 from receiving the activation signals from source 465 to regain access to the memory device. When laptop 470 is inside room 450, then the memory device in laptop 470 can receive the activation signals to gain access to the memory device.

While having access to the embedded or attached memory device, if laptop 470 is carried outside room 450, then the memory device can stop detecting the activation signals outside room 450. As a result, access to the memory device can be revoked. In some embodiments, a host device can be configured to follow a revocation procedure after access revocation. For example, the host device can be configured to send one or more revocation status signals; institute a series of shutdown steps, such as encrypting a file, deleting some contents, or stopping network connection; and/or requiring the host device to be reset before further use of the host device. In at least one embodiment, the system can be configured to activate an alarm or an alert signal when a host device, while having access to an attached memory device, is carried away from the activated zone.

In some embodiments, a memory device can be configured to allow activation in more than one zone. For example, in addition to granting access to laptop 470 by signaling source 465 in room 450, the memory device in laptop 470 can be configured to grant memory access outside room 450 by using one or more signaling sources 405, 415, and 425.

In some embodiments, system 400 (or a portion thereof) can be configured to activate memory devices with GPS signals. Signaling sources can be configured to include at least one GPS satellite, such as signaling source 405. In a specific embodiment, one or more memory devices are configured to receive and process GPS signals. Thus, the associated memory devices can be configured to grant access when one or more sets of GPS signals are received. For example, the sets of GPS signals may represent work location 1, work location 2, a home location, and a client's location. If a memory device of this embodiment is attached to or embedded into a host device, the host device can be granted access when the memory device receives a GPS signal that represents work location 1, work location 2, the home location, or the client's location. If, for example, the host device is to operate in an airport or work location 3, the attached memory device can receive a GPS signal that represents the location of the airport or work location 3. As a result, access to the memory device can be denied. Any previously-granted access may be revoked.

In some embodiments, access can be explicitly block based on one or more GPS coordinates. For example, system 400 (or a portion thereof) can be configured to block and revoke access to a location within a defined geographical region determined, for example, by one or more radii from one or more GPS coordinates.

The foregoing description, for purposes of explanation, used specific nomenclature to provide a thorough understanding of the invention. However, it will be apparent to one skilled in the art that specific details are not required in order to practice the invention. In fact, this description should not be read to limit any feature or aspect of the present invention to any embodiment; rather features and aspects of one embodiment can readily be interchanged with other embodiments.

Thus, the foregoing descriptions of specific embodiments of the invention are presented for purposes of illustration and description. They are not intended to be exhaustive or to limit the invention to the precise forms disclosed; many alternatives, modifications, equivalents, and variations are possible in view of the above teachings. For the purpose of clarity, technical material that is known in the technical fields related to the embodiments has not been described in detail to avoid unnecessarily obscuring the description. Thus, the various embodiments can be modified within the scope and equivalents of the appended claims. Further, the embodiments were chosen and described in order to best explain the principles of the invention and its practical applications; they thereby enable others skilled in the art to best utilize the invention and various embodiments with various modifications as are suited to the particular use contemplated. Notably, not every benefit described herein need be realized by each embodiment of the present invention; rather any specific embodiment can provide one or more of the advantages discussed above. In the claims, elements and/or operations do not imply any particular order of operation, unless explicitly stated in the claims. It is intended that the following claims and their equivalents define the scope of the invention.

What is claimed is:

1. A memory device, comprising:
   multiple layers of non-volatile memory in contact with and fabricated directly on top of a substrate including active circuitry electrically coupled with the multiple layers of non-volatile memory, the multiple layers of non-volatile memory are in contact with one another, the multiple layers of non-volatile memory including an obfuscation layer of memory configured to conceal a portion of data stored in the multiple layers of non-volatile memory;
   a first set of ports formed in association with the multiple layers of non-volatile memory, the flint set of ports being configured to provide access to data stored in the multiple layers of non-volatile memory;
   a logic layer Included in the active circuitry; and
   a second set of ports formed in association with the logic layer, the second set of ports being coupled with the first set of the ports,
   wherein the multiple layers of non-volatile memory are formed upon the logic layer and
   wherein the logic layer comprises a memory storage controller, the memory storage controller including
   a memory storage interface coupled with the second set of ports, the memory storage interface being configured to access the multiple layers of non-volatile memory, and
   a device access determinator including determination logic and a device communication interface configured to receive a signal.

2. The memory device of claim 1, wherein the multiple layers of non-volatile memory are formed vertically stacked upon each other, each layer of the multiple layers of non-volatile memory including a plurality of memory cells with each memory cell including a two-terminal non-volatile memory element.

3. The memory device of claim 1 and further comprising: a switch to activate the obfuscation layer.

4. The memory device of claim 1 and further comprising: a switch configured to erase the portion of data stored in the multiple layers of non-volatile memory.

5. The memory device of claim 1, wherein the obfuscation layer is configured to store encrypted data.

6. The memory device of claim 1, wherein the obfuscation layer is an upper layer configured to obstruct physical access to the multiple layers of non-volatile memory.

7. The memory device of claim 6, wherein the obfuscation layer Is disabled as a memory storage layer.

8. The memory device of claim 1, wherein the first set of ports and the second set of ports are substantially enclosed within the multiple layers of non-volatile memory and the logic layer to prevent physical access to the first set of ports and the second set of the ports.

9. The memory device of claim 1 and further comprising:
   a host device interface coupled with the memory storage controller.

10. The memory device of claim 9, wherein the host device interface is configured to couple with a host device.

11. The memory device of claim 1, wherein the determination logic comprises proximity data, the device access determinator being configured to
    utilize the signal to determine a geographical location of the multiple layers of non-volatile memory, and is further configured to
    compare the geographical location of the multiple layers of non-volatile memory to the proximity data to grant access to the memory storage controller.

12. The memory device of claim 1, wherein the determination logic is configured to access proximity data stored in the multiple layers of non-volatile memory.

13. The memory device of claim 1, wherein the device access determinator is further configured to
    detect the absence of the signal, and
    revoke access to the memory storage controller.

14. The memory device of claim 1 and further comprising:
    an antenna; and
    a signal decoder electrically coupled with the antenna and the device communication interface.

15. The memory device of claim 14 and further comprising:
    a signal encoder electrically coupled with the antenna and the device communication interface, and
    the device communication interface is further configured to send a second signal.

* * * * *

UNITED STATES PATENT AND TRADEMARK OFFICE
CERTIFICATE OF CORRECTION

PATENT NO. : 7,818,523 B2  Page 1 of 1
APPLICATION NO. : 12/008345
DATED : October 19, 2010
INVENTOR(S) : Robert Norman It is certified that error appears in the above-identified patent and that said Letters Patent is hereby corrected as shown below:

In Column 17, Line 61, Claim 1, Replace the word "flint" with the correct word "first".

In Column 17, Line 64, Claim 1, Replace the word "Included" with the word "included".

In Column 17, Line 67, Claim 1, after the words "set of" Delete the word "the".

In Column 18, Line 28, Claim 7, Replace the word "Is" with the word "is".

In Column 18, Line 33, Claim 8, after the words "set of" Delete the word "the".

Signed and Sealed this

Thirtieth Day of November, 2010

David J. Kappos
*Director of the United States Patent and Trademark Office*